(12) United States Patent
Leuthold (10) Patent No.: US 10,585,465 B2
(45) Date of Patent: Mar. 10, 2020

(54) ENVIRONMENTAL STATE PROFILING FOR ELECTRONICS DEVICES ARRANGED IN A MULTI-DIMENSIONAL ARRAY

(71) Applicant: SEAGATE TECHNOLOGY LLC, Cupertino, CA (US)

(72) Inventor: Hans Leuthold, Santa Cruz, CA (US)

(73) Assignee: Seagate Technology LLC, Cupertino, CA (US)

( * ) Notice: Subject to any disclaimer, the term of this patent is extended or adjusted under 35 U.S.C. 154(b) by 412 days.

(21) Appl. No.: 15/210,624

(22) Filed: Jul. 14, 2016

(65) Prior Publication Data
US 2018/0018003 A1   Jan. 18, 2018

(51) Int. Cl.
| | | |
|---|---|---|
| G06F 1/20 | (2006.01) | |
| H05K 7/20 | (2006.01) | |
| G11B 33/14 | (2006.01) | |
| G11B 33/12 | (2006.01) | |

(52) U.S. Cl.
CPC ............ *G06F 1/206* (2013.01); *G06F 1/20* (2013.01); *G11B 33/128* (2013.01); *G11B 33/1406* (2013.01); *H05K 7/20736* (2013.01)

(58) Field of Classification Search
CPC ......... G06F 1/206; G06F 1/20; G11B 33/128; G11B 33/1406; H05K 7/20736
USPC ...................................................... 700/282
See application file for complete search history.

(56) References Cited

U.S. PATENT DOCUMENTS

| | | |
|---|---|---|
| 3,893,178 A | 7/1975 | Sordello |
| 5,129,088 A | 7/1992 | Auslander et al. |
| 6,076,142 A | 6/2000 | Corrington et al. |
| 6,188,571 B1 | 2/2001 | Roganti et al. |
| 6,266,203 B1 | 7/2001 | Street et al. |
| 6,744,586 B2 | 6/2004 | Ukani et al. |
| 7,319,570 B2 | 1/2008 | Jia et al. |
| 7,487,229 B2 | 2/2009 | Ohly |
| 8,250,881 B1 | 8/2012 | Reihl |
| 8,751,836 B1 | 6/2014 | Piszczek et al. |
| 8,897,017 B2 | 11/2014 | Brashers et al. |
| 9,014,870 B2 | 4/2015 | Chiu et al. |
| 9,192,078 B2 | 11/2015 | Pronozuk et al. |
| 9,723,762 B1 * | 8/2017 | Ross ................... H05K 7/20827 |
| 2002/0066047 A1 * | 5/2002 | Olarig ...................... G06F 1/206 713/323 |
| 2009/0067080 A1 * | 3/2009 | Gross ...................... G11B 33/08 360/71 |
| 2013/0166091 A1 | 6/2013 | Chiu et al. |
| 2014/0320308 A1 | 10/2014 | Lewis |

(Continued)

*Primary Examiner* — James J Lee
*Assistant Examiner* — Michael W Choi
(74) *Attorney, Agent, or Firm* — Hall Estill Attorneys at Law (57) ABSTRACT

Apparatus and method for environmentally monitoring electronics devices. Each electronics device has an environmental sensor configured to monitor an environmental state. Environmental control logic, including computer instructions stored in the memory, is configured to simultaneously query, with respect to a global clock, at least a subset of the electronics devices to read the respective sensors and thereby obtain a set of environmental data points, and to map the set of environmental data points in relation to the sensor locations forming a transmissibility mode profile (TMP).

20 Claims, 11 Drawing Sheets

(56) References Cited

U.S. PATENT DOCUMENTS

| | | | | |
|---|---|---|---|---|
| 2015/0120636 A1* | 4/2015 | Gao | ................... | G06F 11/3447 |
| | | | | 706/47 |
| 2015/0338281 A1* | 11/2015 | Ross | ....................... | G01K 3/14 |
| | | | | 236/44 A |
| 2016/0187018 A1* | 6/2016 | Honma | ................. | G06F 9/5094 |
| | | | | 700/276 |
| 2016/0352500 A1* | 12/2016 | Benjamini | ................ | H04L 7/04 |

\* cited by examiner

ENVIRONMENTAL STATE PROFILING FOR ELECTRONICS DEVICES ARRANGED IN A MULTI-DIMENSIONAL ARRAY

SUMMARY

Some embodiments of the present technology contemplate an apparatus having a plurality of data storage devices. Each data storage device has an environmental sensor configured to monitor an environmental state. A controller has a memory and is configured to perform control of input/output (I/O) transactions for each of the plurality of data storage devices. Environmental control logic, including computer instructions stored in the memory, is configured to query, at least a subset of the data storage devices to read the environmental sensors and obtain environmental data points, and to map the environmental data points in relation to sensor locations forming a transmissibility mode profile (TMP).

Some embodiments of the present technology contemplate a system having an enclosure and a plurality of data storage devices in the enclosure. Each data storage device has an environmental sensor and operates according to an individual clock. A global clock is also for the plurality of data storage devices. Sync logic computer instructions stored in a computer memory are configured to synchronize each individual clock to the global clock. Environmental control logic computer instructions stored in a computer memory are configured to simultaneously, in relation to the global clock, obtain environmental data points from the environmental sensors of at least a subset of the plurality of data storage devices, and to construct a profile of the environmental data points in relation to locations of the environmental sensors.

Some embodiments of the present technology contemplate a computer-implemented method for operating an apparatus having a plurality of data storage devices. The method includes: establishing a global clock among the plurality of data storage devices; simultaneously obtaining environmental data points from at least a subset of the data storage devices according to the global clock; and responsive to at least one of the environmental data points varying a predetermined amount from a threshold value, adjusting an environmental state of the apparatus.

DETAILED DESCRIPTION

Initially, it is to be appreciated that this disclosure is by way of example only, not by limitation. The environmental control concepts herein are not limited to use or application with any specific system or method. Thus, although the instrumentalities described herein are for the convenience of explanation, shown and described with respect to exemplary embodiments, it will be appreciated that the principles herein may be applied equally in other types of systems and methods involving environmental state control for electronics devices in an enclosure.

The present disclosure generally relates to processor-based electronics systems, and more particularly to monitoring an environmental state inside an electronics enclosure in order to maintain a desired operational reliability of the electronics devices. The illustrative embodiments herein deal with data storage devices in a storage enclosure, although the claimed embodiments are not so limited.

Networked data storage systems, such as object storage systems used in cloud computing environments, often employ multiple data storage devices that are operationally arranged to provide a relatively high data capacity memory storage space. The devices may be grouped together into a storage enclosure that can be removably installed into a rack system, such as the arrangement in a server cabinet. Such data storage systems can take a variety of forms including servers, cloud storage modules, RAID (redundant array of independent drives) systems, extended memory systems (JBODs, or "just a box of drives"), and the like. The data storage systems can be accessed locally or over a network including a local area network (LAN), a wide area network (WAN), the Internet, and the like.

Conventional data storage systems have continuously been redesigned to pack more storage capacity into smaller enclosure sizes. Miniaturized data storage devices packed closer together can create concerns that were negligible in the past. For example, the desired reliability of modern data storage systems can be diminished by small amounts of heat or vibration. Accordingly, various embodiments of the present disclosure are generally directed to an apparatus and method for predicting when an environmental state inside an enclosure containing processing devices should be adjusted to reduce the likelihood of data storage failure.

As for heat buildup, typically a storage enclosure has a housing adapted to be mounted within a rack system between a cold zone and a warm zone. The cold zone may be a cold aisle proximate one side of the storage enclosure and the warm zone may be a warm aisle proximate another side of the storage enclosure. A plurality of data storage devices, such as hard disc drives (HDDs), solid state drives (SSDs), hybrid drives, and the like, can be arranged and mounted in the enclosure and a coolant airflow passes over them from the cold zone to the warm zone, removing heat generated by the data storage devices from the enclosure to prevent excessive heat buildup. Typically, the data storage devices mounted nearer the cold zone have a higher heat transmissibility because the coolant airflow is substantially the same temperature as the cold zone. Heat transmitted by those data storage devices flows over the data storage devices nearer the warm zone, so the coolant airflow temperature increases in flowing from the cold zone to the warm zone. Thus, the heat transmissibility of the data storage devices nearer the warm zone is less than the data storage devices nearer the cold zone, meaning the former operate at a higher temperature. The present technology maps the heat transmissibility in relation to data storage device location in the enclosure to form a transmissibility mode profile (TMP). A current TMP can be used as a reference for comparing subsequent sample TMPs to predict a data storage device trending toward failure. While data storage devices are a particularly useful type of processing device to which the technology discussed herein can be applied, it will be appreciated that other electronic processing devices and systems, such as controllers, boards, operational modules, and the like can also benefit from this technology and are contemplated by the present disclosure.

Figure 1:
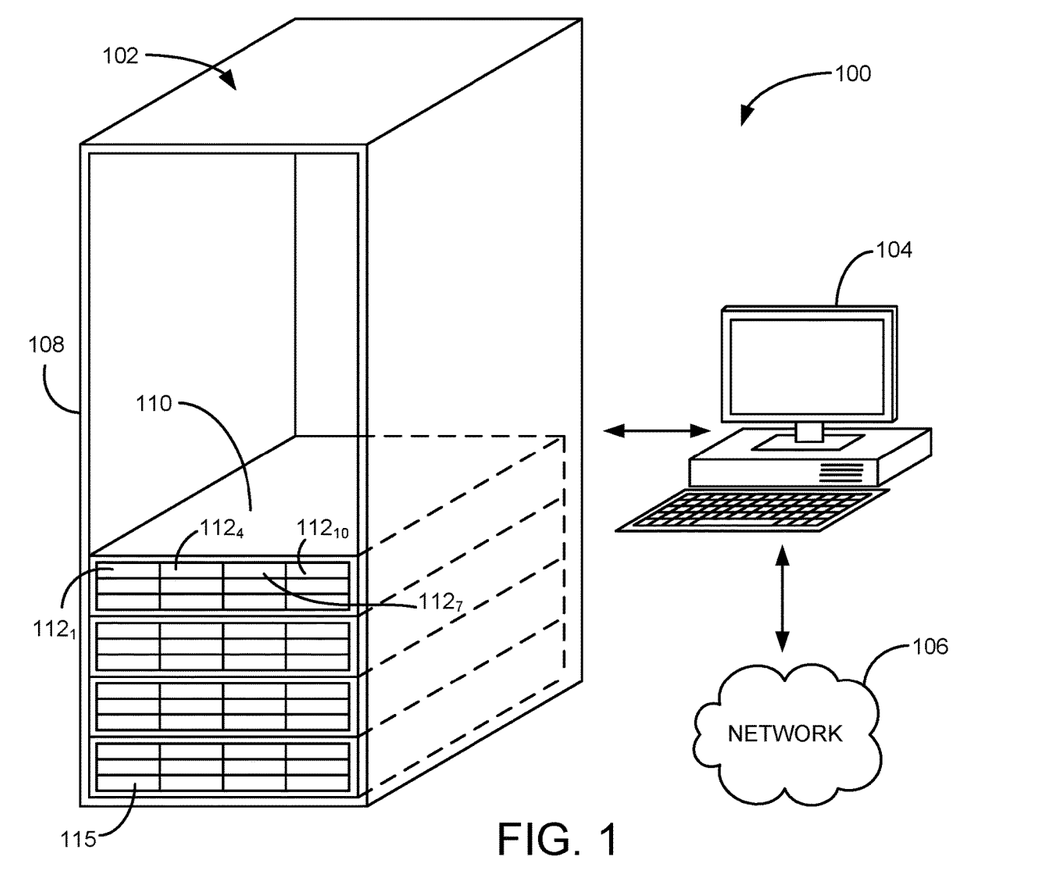
FIG. 1 depicts a functional representation of a storage rack that houses a number of storage enclosures.

These and other features can be understood beginning with a review of FIG. 1 which generally depicts a storage system 100 in accordance with illustrative embodiments. The system 100 includes a storage assembly 102 coupled to a computer 104 which, in turn, is connected to a network 106. The computer 104 can take a variety of forms such as a work station, a local personal computer, a server, and the like. The storage assembly 102 includes a server cabinet (rack) 108 and a plurality of modular storage enclosures 110. In some cases, all or some of the storage system 100 can represent a storage node of an object storage system.

Figure 2:
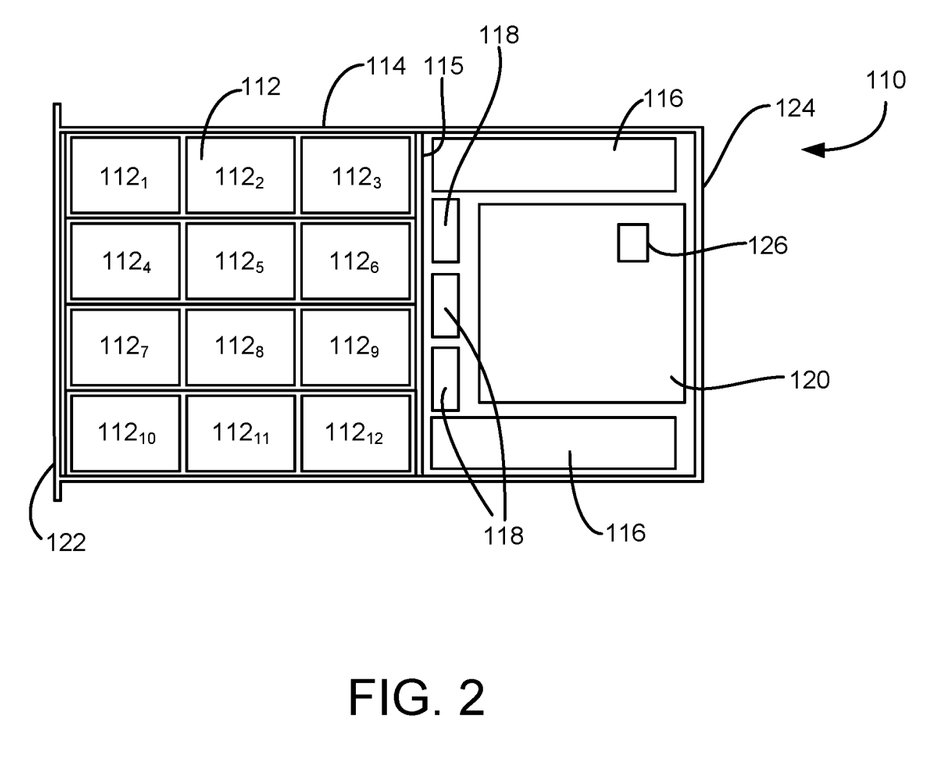
FIG. 2 depicts a top representation of a storage enclosure in FIG. 1.

One illustrative configuration for the storage enclosures 110 is depicted in FIG. 2. The configuration in FIG. 2 is a 36/2 U configuration with 36 (3×3×4) data storage devices 112 in a 2 U form factor height housing. A variety of other configurations can be used including storage enclosures with a total of N drives where N=12, 16, 20, 24, 30, 32, 48, etc. Sleds 115 can be used to secure multiple sets of the storage devices 112. As desired, the sleds 115 can be individually inserted into and withdrawn from the enclosure 110.

In some embodiments, the storage system 100 (FIG. 1) may be in an environmentally controlled room so that a user accessible walkway (aisle) adjacent one side of the storage cabinet 102 is at the $T_{COLD}$ temperature, such as about T=20° C. Another side of the cabinet 102 may be adjacent a second walkway at the $T_{WARM}$ temperature, which may be significantly higher such as about T=40° C. Other respective ambient temperatures may be present. It is contemplated that the warm aisle will be warmer than the cold aisle due to the venting of exhaust heat from the system as the fans (e.g., 118, FIG. 2) draw airflow through the storage enclosures 110 from the cold aisle side 122 to the warm aisle side 124.

The storage enclosure 110 can include dual power supplies 116, multiple airflow fans 118 and at least one controller 120. The power supplies 116 provide electrical power for the storage enclosures 110. The fans 118 draw airflow from openings (not separately shown) on the cold aisle side 122 of the housing 114 and pull the airflow through the housing 114 and out openings (not shown) on the warm aisle side 124 of the housing.

The controller 120 may have one or more intelligent processors 126 and can take a variety of configurations including but not limited to a server, a controller (including dual redundant RAID controllers), a cloud controller, dual port controllers, an Ethernet drive controller, etc. The controller 120 is configured to execute stored applications and to perform control of input/output (I/O) transactions between a host and each of the data storage devices 112. Other support electronics and components can be provided in the storage enclosure 110 as well, including a boot storage memory device, wiring cables, switches, brackets, LED indicators, etc. A redundant design is provided so that substantially any active failed component can be replaced while maintaining the device in an operational condition, including an entire sled 115 of storage devices 112 in which at least one device 112 has failed. Other relative arrangements and placements of the various active elements within the enclosure 110 can be provided as desired.

Figure 3:
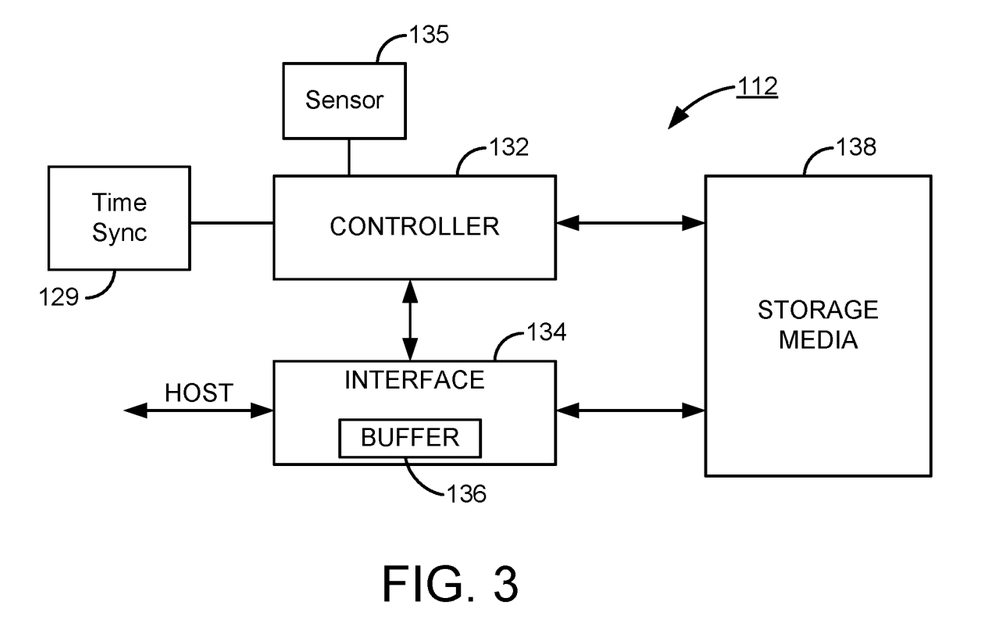
FIG. 3 depicts a functional block representation of a data storage device in FIG. 2.

FIG. 3 depicts a generalized functional block diagram for the data storage device 112 in accordance with some embodiments. The data storage device 112 includes a processor-based programmable controller 132, an interface circuit 134 with a data buffer 136, and storage media 138. An environmental sensor 135 is capable of sensing an environmental state of the data storage device 112, such as temperature, vibration, etc. Each data storage device 112 operates according to its own individual clock 129.

Figure 4:
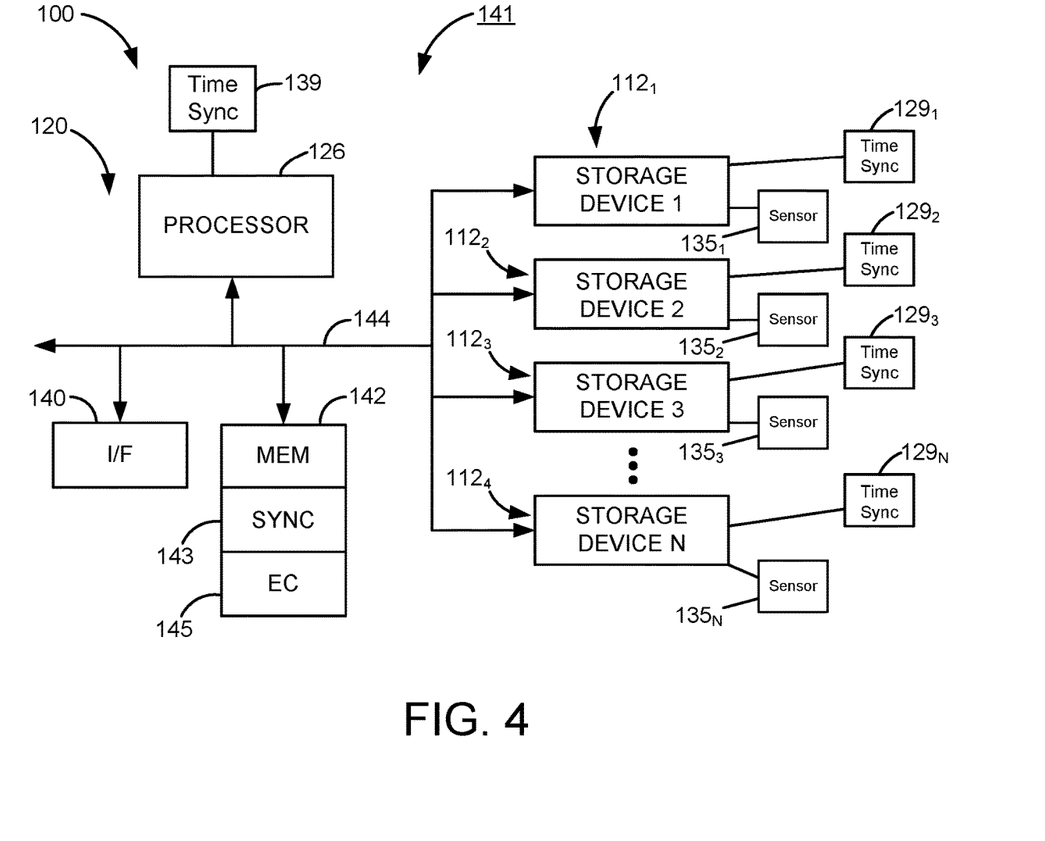
FIG. 4 depicts a functional block representation of a synchronization system in accordance with illustrative embodiments of this technology.

FIG. 4 is a functional block depiction of a synchronization system 141 constructed and operated in accordance with illustrative embodiments of this technology. The controller 120 includes the aforementioned processor 126 as well as an interface (I/F) circuit 140 and a local buffer memory (memo) 142. One or more bus structures 144 enable the passage of data and commands between the storage devices $112_n$ (labeled 1 to N) and a host device, such as the local computer 104 in FIG. 1. Computer applications reside in the memory 142 for selective execution by the processor 126. A synchronization routine (SYNC) 143 is executed to synchronize the individual clocks 129 of the data storage devices 112 to the global clock 139. An environmental control (EC) routine 145 is executed to simultaneously query, via the SYNC 143, at least a subset of the data storage devices 112 to read the sensors 135 in order to obtain a set of environmental data points. The set of environmental data points is mapped in relation to the sensor locations to form a transmissibility mode profile (TMP) that is discussed below.

The synchronization system 141 is capable of synchronizing local times (such as $129_1$, $129_2$, $129_3$, $129_N$) at child nodes (e.g., such as data storage devices $112_1$, $112_2$, $112_3$, ... $112_N$) to the same parent node (such as controller 120) in a computer network. The time synchronization system 141 is configured to synchronize the local times at the child nodes by mapping local time stamp values to corresponding global time stamp values associated with a global time source (e.g., such as the global clock 139 implemented by the controller 120). Time sample pairs formed by pairing local time stamps and global time stamps are used to relate local times to the global time. Furthermore, interpolation between time sample pairs is employed to allow any local time stamp occurring between time sample pairs to be mapped to a corresponding global time stamp.

Any or all of the child nodes $112_n$ and/or the parent node 120 may be any kind of node, such as, but not limited to, a computer network node, such as a stand-alone computer (such as the computer 104 of FIG. 1), a server, a bridge, a router, a data storage device, etc. Additionally or alternatively, any or all of the child nodes $112_n$ and/or the parent node 120 may be a wireless network node, such as a mobile cellular telephone, a cordless digital telephone, a wireless access point, etc. Additionally or alternatively, the child nodes $112_n$ and/or the parent node 120 may be individual processing elements in, for example, a multiprocessor system, a parallel processing system, etc. In such a configuration, the communication network 144 may be eliminated and/or replaced by a bus or other local communication path as explained below. Furthermore, the child nodes $112_n$ and/or the parent node 120 can include any combination of such aforementioned nodes or the like.

The communication network 144 may be any kind of communication network, such as, but not limited to, a computer communication network, such as the Internet, a proprietary local area network (LAN) or wide area network (WAN), a dedicated leased line network link, a point-to-point microwave/satellite network, etc. Additionally or alternatively, the communication network 144 may be a wireless digital network, such as a mobile cellular network, a wireless digital network (e.g., WLAN, WiFi, WIMAX and/or Bluetooth), etc. Additionally or alternatively, the communication network 144 may be a communication interconnect, backplane, shared memory, etc. configured to communicatively couple multiple, individual processing elements in a multiprocessor system, a parallel processing system and/or the like. Furthermore, the communication network 144 may include any combination of such aforementioned communication networks or the like.

Although FIG. 4 depicts one parent node 120 and four child nodes $112_n$ for clarity, the example time synchronization system 141 and the techniques disclosed herein may be adapted to support any number of parent nodes and child nodes. Furthermore, although FIG. 4 depicts a single communication network 144 for clarity, the example time synchronization system 141 and the techniques disclosed herein may be adapted to support any number of communication networks and any configuration of parent node(s) and child node(s).

To enable local time synchronization, the example system includes time synchronizers $129_1$, $129_2$, $129_3$, and $129_N$. Any or all of the time synchronizers $129_n$ may be implemented as general purpose time synchronizers and/or special purpose time synchronizers. General purpose time synchronizers are capable of supporting both time measurement reporting and time interpolation and mapping, and may be used with parent nodes (i.e., global time sources) and/or child nodes. Special purpose time synchronizers, on the other hand, may be configured to support only measurement reporting or time interpolation and mapping, and/or may be configured to be used with only parent nodes (i.e., global time sources) or child nodes.

Figure 5:
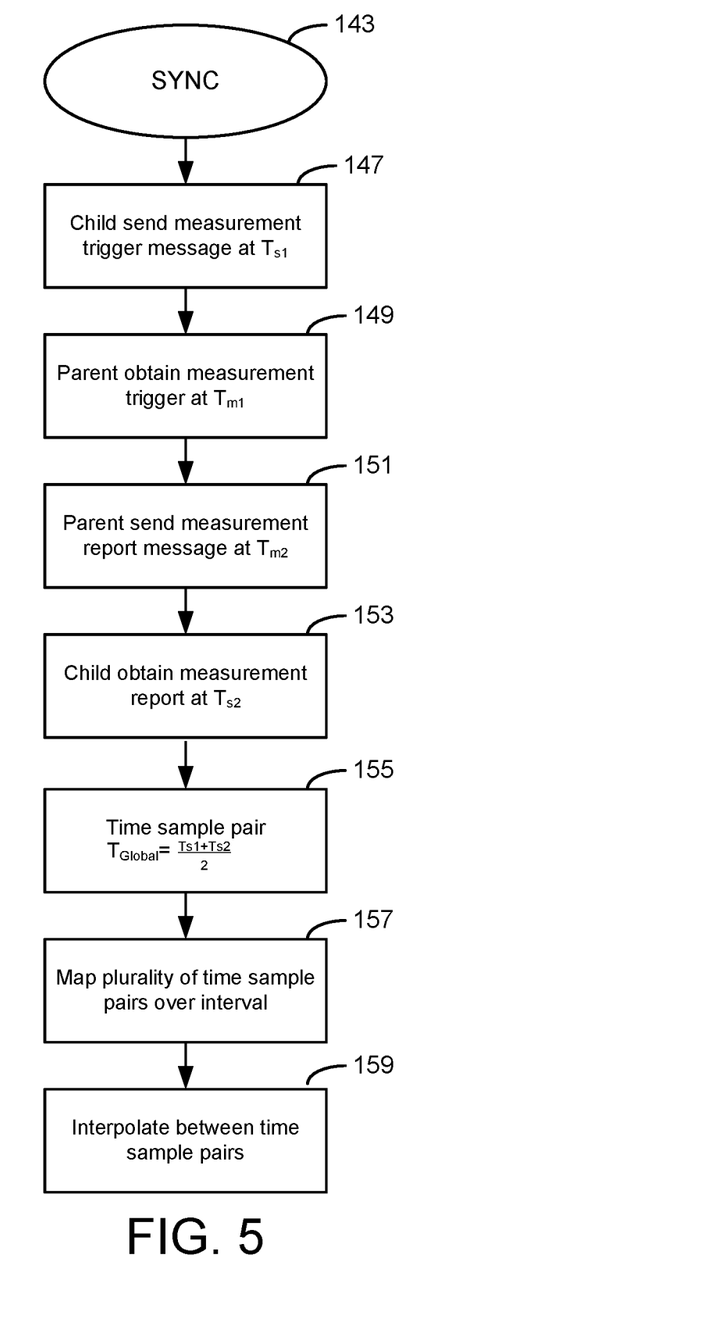
FIG. 5 depicts a flow chart of steps in a method for the SYNC routine in FIG. 4.

FIG. 5 depicts a flowchart of steps in an illustrative example of the SYNC 143 routine within the time synchronization system 141. Each time synchronizer $129_n$ is configured to locally map local time values associated with its respective child node $112_n$ to corresponding global time values associated with the parent node 120. For example, focusing on child node $112_1$, its time synchronizer $129_1$ may be configured to relate local times to global times at desired (e.g., predetermined) time intervals by determining time sample pairs (TSPs) in which a particular time sample pair includes a local time measurement and a corresponding global time measurement.

In these illustrative embodiments the routine begins in block 147 where the time synchronizer $129_1$ may send a measurement trigger message over the communication network 144 to the parent node 120 and/or the time synchronizer 139 associated with the parent node 120 at local (child) time $T_{S1}$. In block 149, the time synchronizer 139 may be configured to obtain a first (e.g., send) local time stamp when the measurement trigger message is sent to the parent node 120 and/or time synchronizer 139 at global (parent) time $T_{M1}$.

In block 151, in response to the trigger message, the time synchronizer 139 may send the global time measurement (e.g., global time stamp) to the time synchronizer $129_1$ or associated child node $112_1$ via a measurement reporting message sent over the communication network 144 at parent time $T_{M2}$. In block 153, the time synchronizer $129_1$ may then be configured to obtain a second (e.g., receive) local time stamp when the measurement reporting message is received from the parent node 120 and/or time synchronizer 139 at child time $T_{S2}$. Assuming that propagation time for both messages is approximately equal and the time to obtain the global time stamp $(T_{M2}-T_{M1})$ is negligible, in block 155 the average of the first (send at $T_{S1}$) and second (receive at $T_{S2}$) local time stamps corresponds to the absolute time at which the global time stamp was generated. Thus, the time synchronizer $129_1$ may determine the local time measurement corresponding to the global time measurement by averaging the first (send) local time stamp and the second (receive) local time stamp. The resulting local and global time sample pair are time synchronized.

In block 157 the steps above are repeated to determine a sequence of TSPs at desired (predetermined) time intervals to synchronize local times to global times over a desired (predetermined) time domain. In block 159 the time synchronizer $129_1$ may be configured to implement an interpolation between TSPs to allow any local time value occurring in an interval between adjacent TSPs to be related (mapped) to a corresponding global time value in the interval. Thus, to map a particular local time value to a corresponding global time value, the time synchronizer $129_1$ selects the time interval in which the particular local value lies, and then evaluates the selected interval to determine the local time value corresponding to the particular global time value.

The synchronization system 141 performs this synchronization procedure for each of the storage devices $112_n$ in order to simultaneously, with respect to global time (meaning "at the same global time"), query at least some, if not all, of the data storage devices for reading the corresponding sensors $135_n$. The simultaneous readings provide a set of environmental data points that the controller 120 maps in relation to the respective sensor locations in order to form the transmissibility mode profile (TMP).

Similarly for vibration buildup, where the data storage devices include hard disc drives ("HDDs"), servo positioning in an HDD can be adversely affected by excessive vibration. Mechanical excitation can be generated by the rotating disc(s) in one or more of the data storage devices 112, or by other components in the storage enclosure 110 such as the fans 118, or by external forces acting on the storage enclosure such as facility air conditioning systems and the like.

Figure 6:
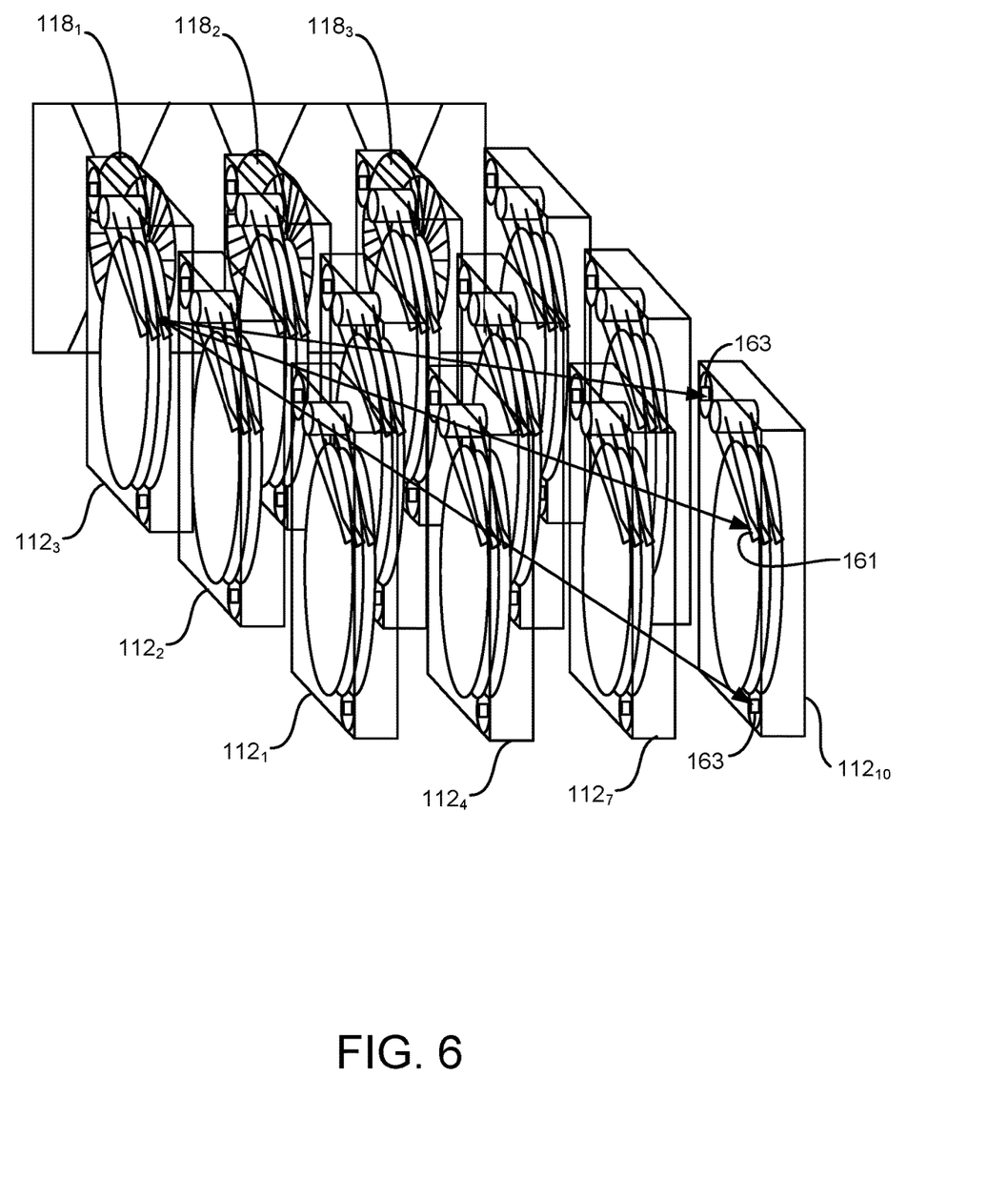
FIG. 6 is an isometric depiction of a portion of the storage enclosure of FIG. 2.

FIG. 6 is an isometric diagrammatic depiction of the storage enclosure 110 of FIG. 2. Each of the data storage devices 112 in these illustrative embodiments is an HDD. Each HDD has a processor-based servo-positioning module (not shown, such as in controller 132) that compensates for position error of transducer heads 161 caused by sources of position error such as vibration. Each HDD in these illustrative embodiments, as is customary, also has one or more vibration sensors 163 monitoring the magnitude of vibration acting on the HDD. For example, FIG. 6 depicts how an unexpected, or transient, vibration generated by fan $118_1$ propagates through interconnected structural components to each of the HDDs in the array, creating position error of the heads 161 and stimulating the vibration sensors 163. The effects of fan $118_1$ vibration vary on each of the HDDs, depending on their respective proximity to the source of vibration. Similarly to heat buildup, the present technology can simultaneously capture a frame of vibration data from the servo system and vibration sensor of each respective HDD and map the vibration in relation to HDD location in the enclosure 110 to form the TMP. As stated before, a current TMP can then be used as a reference for comparing subsequent TMPs to predictively maintain the HDDs in service.

Returning now to FIGS. 1 and 2 to illustrate the derivation and use of the TMP. For purposes of an illustrative disclosure, the environmental state being monitored is temperature so the sensors $135_n$ can be temperature sensors. In alternative contemplated embodiments the environmental state can be vibration so the sensors can be vibration sensors and/or servo-positioning compensation data from HDDs.

For purposes of continuing the illustrative example for temperature, it is imperative for the data storage devices 112 to be operated below the manufacturer's temperature specifications in order to ensure the reliability of storing data to and retrieving data from the data storage device. Modern data storage devices typically have integrated temperature sensors for measuring the individual temperature of the respective device. The present technology leverages these individual temperature measurements to construct profiles corresponding to meaningful positions of at least a subset of the plurality of data storage devices.

The sled 115 contains twelve data storage devices $112_1$-$112_{12}$ arranged in a rectangular array. Four rows of three data storage devices $112_n$ each are aligned with the direction of the cooling airflow from the cold zone side 122 to the warm zone side 124 of the sled 115. The cooling air entering the cold zone side 122 is warmed by the heat transmitted from the first data storage device $112_1$ in that particular row. Thus, during normal steady-state operations it is expected that the first data storage device $112_1$ will operate at a relatively higher heat transmissibility, and thus cooler temperature, than the second data storage device $112_2$. For the same reason, heat transmitted by the first and second data storage devices $112_1$, $112_2$ warms the cooling airflow going to the third data storage device $112_3$. Thus, the TMP for this row of data storage devices is expected to indicate that the first (cold aisle side) data storage device $112_1$ is the relatively coolest and the last (warm aisle side) data storage device $112_3$ is the relatively warmest.

Figure 7:
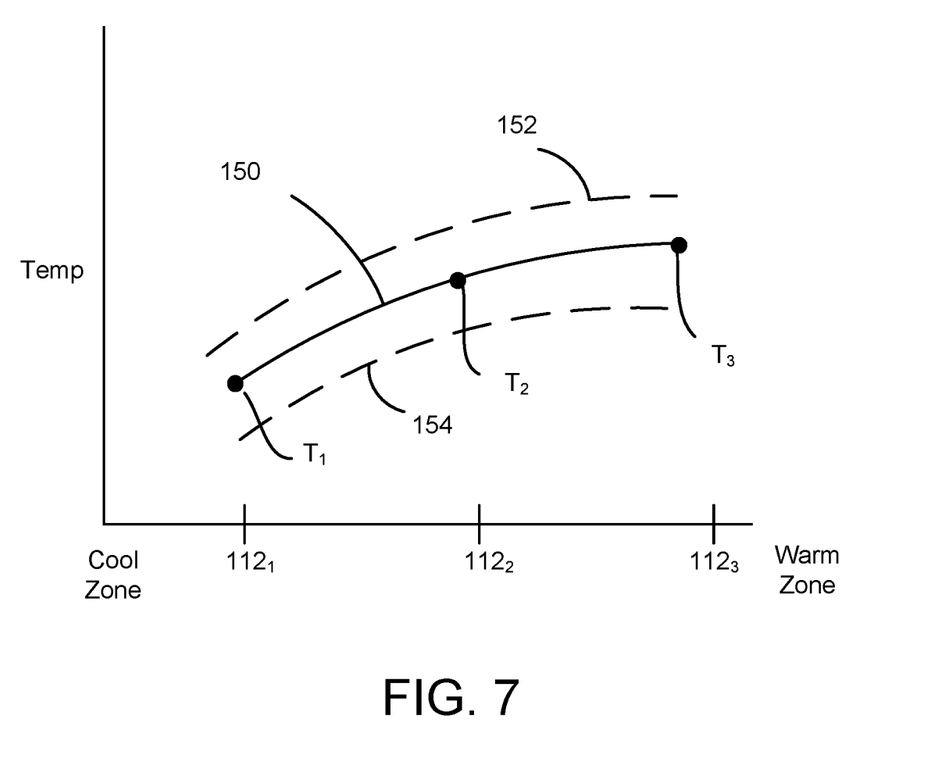
FIG. 7 depicts a reference transmissibility mode profile (TMP) of the present technology.

FIG. 7 depicts a TMP 150 for simultaneous (performing SYNC 143) temperature measurements obtained for the data storage devices $112_1$, $112_2$, $112_3$. The respective temperatures $T_1$, $T_2$, $T_3$ are environmental data points mapped in the TMP 150 in relation to their sequential locations in the row they define from adjacent the cold zone at 124 to adjacent the warm zone at 124. That is, like their sequential arrangement in the sled 115, the environmental data points $T_1$, $T_2$, $T_3$ are mapped sequentially from left to right. As expected, the first data storage device $112_1$ is operating at the relatively coolest temperature $T_1$, the third data storage device $112_3$ is operating at the relatively warmest temperature $T_3$, and the second data storage device $112_2$ is operating at a medial temperature $T_2$.

Figure 8:
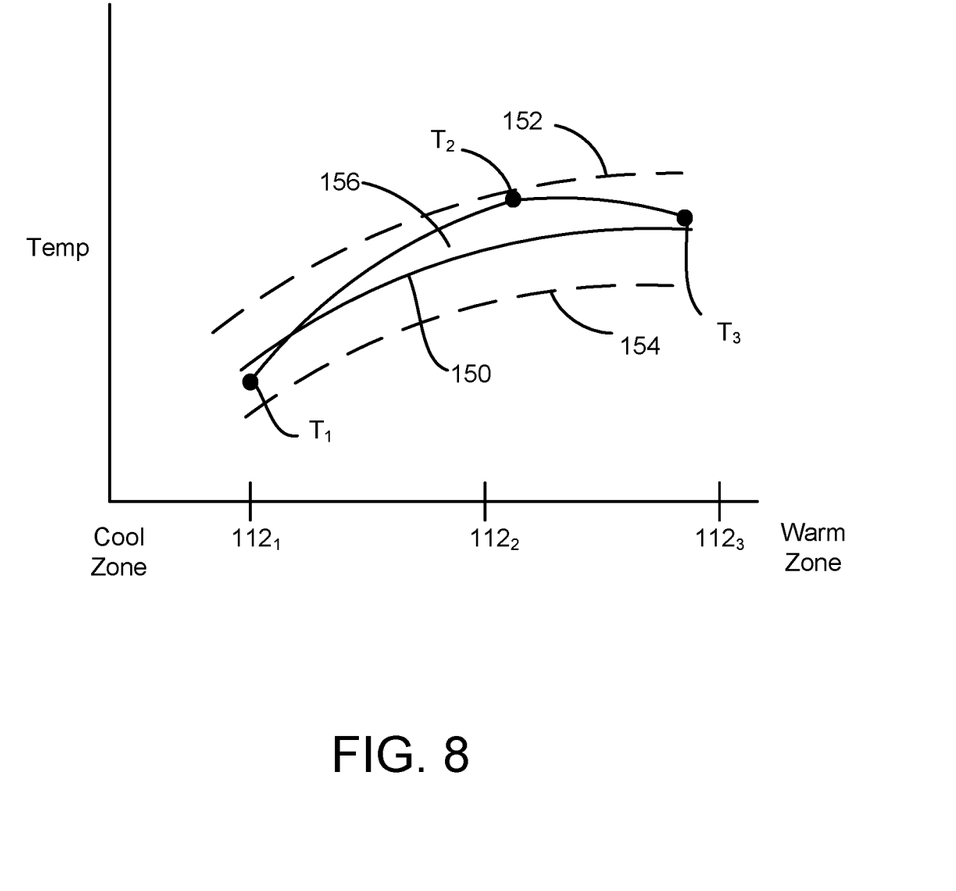
FIG. 8 depicts a sample TMP in comparison to the reference TMP in FIG. 6.

A curve-fitting operation can be performed to fit the environmental data points to the curve defining the TMP 150. This reference TMP 150 thus provides an empirically derived mode shape for the subset of data storage devices 112, representing the observed performance at a particular time. Reference TMPs can be mapped for different particular times, such as during start up and during steady-state operations at various I/O loadings. The reference TMP 150 can advantageously be used for compliance comparisons of subsequent sample TMPs. For example, a statistical correlation strength can be performed to compare variation of sample TMPs to the reference TMP. A correlation below a predetermined limit can signal an early prediction of potential failure, and can trigger corrective actions that make adjustments that affect the environmental data point values. In these depicted embodiments the reference TMP 150 is provided with a predetermined (statistically derived) upper boundary 152 and a lower boundary 154. The reference TMP 150 can then be used to identify any environmental data point that varies beyond the calculated limits of expected variation. For example, FIG. 8 depicts the reference TMP 150 of FIG. 7 used to check compliance of a sample TMP 156. It is apparent that the second data storage device $112_2$ is experiencing an unexpectedly high heat transmissibility. In this event the controller 126 can be programmed to intervene with environmental adjustment measures to reduce the likelihood of a catastrophic data loss failure.

Figure 9:
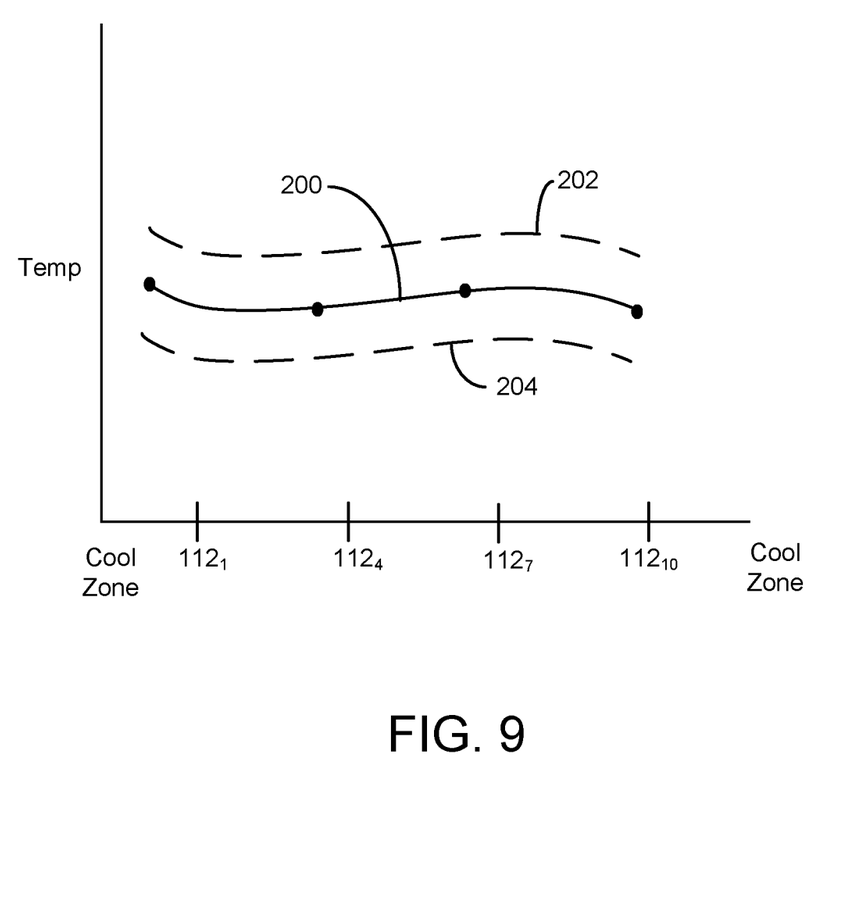
FIG. 9 depicts another reference TMP of the present technology.

FIG. 9 depicts another reference TMP 200 for the data storage devices $112_1$, $112_4$, $112_7$, $112_{10}$ in the sled 115 arrangement of FIG. 2. Here the expected temperatures are about the same because all of these data storage devices 112 are closest to the cool zone adjacent the side 122. As before, these data storage devices are simultaneously sampled for temperatures and those environmental data points are plotted and curve-fit to derive the reference TMP 200. Expected boundaries 202, 204 are likewise calculated for an allowable amount of deviation from the expected temperature.

Figure 10:
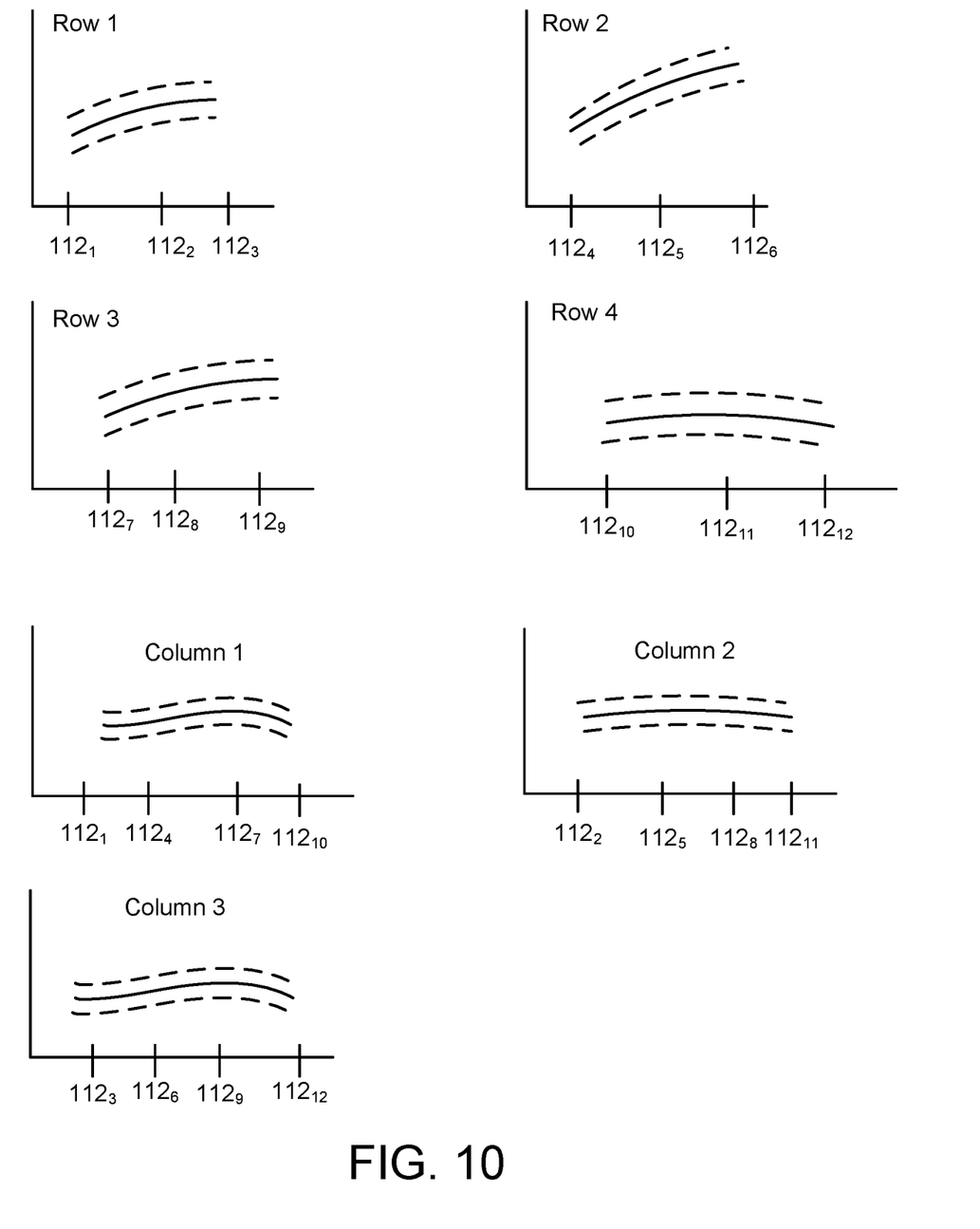
FIG. 10 depicts a compilation of all column and row reference TMPs for the data storage device array in FIG. 2.

FIG. 10 depicts a graphical representation of all the row and column reference TPMs that can be monitored by a computer in real time after simultaneously obtaining all the environmental data points for the data storage devices 112 in the sled 115 depicted in FIG. 2. This measurement granularity is significantly better than prior attempted solutions that monitor the temperatures individually, or that have temperature sensors located in the enclosure that operate independently of the data storage devices. Note that in this computer monitoring of temperature each data storage device is displayed twice, once in each row and once in each column. That makes it possible to ratify the results because any particular data storage device 112 that appears to be running hot in its row sample TMP should likewise indicate running hot in its column sample TMP.

Figure 11:
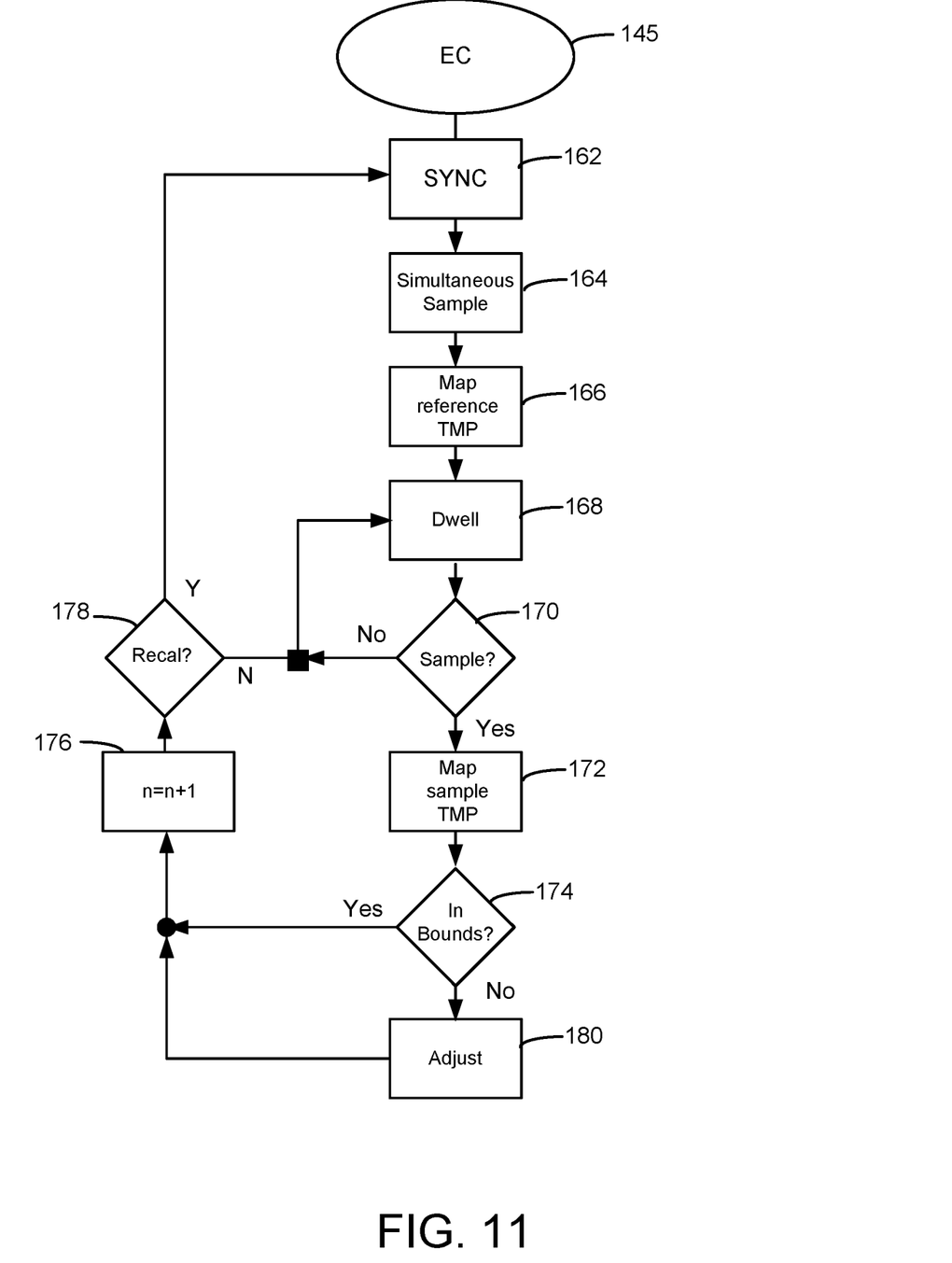
FIG. 11 depicts a flow chart of steps in the environmental control (EC) method in FIG. 4.

FIG. 11 depicts a flowchart of steps in the EC 145 (FIG. 4) routine in accordance with illustrative embodiments of this technology. The method begins in block 162 with synchronizing all the data storage devices to the global clock, as discussed in FIG. 5. Once synchronized, the data storage devices are simultaneously queried to obtain the environmental data points, in this case the data storage device temperatures. As discussed previously, in equivalent alternative embodiments the environmental data points can be data storage device vibrations. Control then passes to block 166 in which the environmental data points are mapped in relation to sensor locations in order to form a reference TMP. The mapping can include calculating the upper and lower boundaries of expected variation. Although using a reference TMP for comparison is disclosed, the contemplated embodiments are not so limited. In alternative embodiments the reference can simply be a threshold value that a sample TMP conforms to in comparison if all of the environmental data points are below the threshold value.

With the reference TMP stored in memory, the method dwells in block 168 for a predetermined period of time while the data storage devices are operational. In block 170 the determination is made whether it is time to obtain another sample TMP for comparison to the reference TMP. If the determination of block 170 is "no," then control returns to block 168 where the dwell period continues. If, however, the determination of block 168 is "yes," then in block 172 another set of environmental data points is obtained and a sample TMP is mapped and compared to the reference TMP. In block 174 the determination is made whether the sample TMP is within the boundaries of the reference TMP. If the determination of block 174 is "yes," then in block 176 an index is incremented. The index can be used in block 178 to determine whether the reference TMP should be recalculated. This can be advantageous to compensate for any process variation over time. By delaying recalibration, a particular reference TMP can be used for comparison against a number of sample TMPs.

If the determination of block 178 is "yes," then control returns to block 162 and a new reference TMP is mapped. In this mode, the next sample TMP is compared against a new reference TMP. Contrarily, if the determination of block 178 is "no," then control returns to block 168 and further sampling is performed against the current reference TMP. In this mode the controller is configured to map a plurality of sample TMPs and compare to the same reference TMP.

If, however, the determination of block 174 is "no," then control passes to block 180 where the controller calls for an environmental state adjustment as a predictive failure measure to prevent a catastrophic failure. In the illustrative example where the environmental data points are temperature, then the controller 126 can call for adjusting the power supplied to the fans 118 (generally "air handler") to alter fan speed and, in turn, alter the cooling airflow across the data storage devices 112. The controller 126 can also change the cooling airflow by adjusting the position of an airflow damper inside the housing between the inlet side 122 and the outlet side 124. Alternatively, the controller can adjust the I/O workload for at least a subset of the plurality of data storage devices to route workload away from a suspect data storage device to reduce heat generated by it.

It is to be understood that even though numerous characteristics and advantages of various embodiments of the present disclosure have been set forth in the foregoing description, together with details of the structure and function of various embodiments thereof, this detailed description is illustrative only, and changes may be made in detail, especially in matters of structure and arrangements of parts within the principles of the present disclosure to the full extent indicated by the broad general meaning of the terms in which the appended claims are expressed. While data storage devices such as HDDs, SSDs and hybrid drives have been exemplified as different types of processing devices to which the transmissibility mode profile operation can be applied, such is merely exemplary and is not limiting. Any number of different types of processing devices that generate heat and/or vibration at fixed locations during operation are suited for practicing the transmissibility mode profiling of the present technology.

What is claimed is:

1. An apparatus comprising:
    a plurality of data storage devices each having storage media and an environmental sensor configured to monitor an environmental state of the associated data storage device, the data storage devices arranged in a multi-dimensional array along at least two orthogonal axes;
    a controller having a memory and configured to perform control of input/output (I/O) transactions between the memory and the storage media of each of the plurality of data storage devices; and
    environmental control logic including computer instructions stored in the memory and configured to query at least a subset of the data storage devices to obtain first environmental data points indicative of the environmental states of the data storage devices, to map the first environmental data points in relation to sensor locations to form a reference a transmissibility mode profile (TMP) which identifies a normal set of the environmental states of the data storage devices along the first and second orthogonal axes of the multi-dimensional array, the controller further configured to subsequently query the at least a subset of the data storage devices to obtain second environmental data points, to map the second environmental data points in relation to the sensor locations to form a sample TMP, to identify a selected data storage device at a selected location that presents variations between the sample TMP and the reference TMP by more than a predetermined interval along both the first and second orthogonal axes, to identify a component of the apparatus that is a source of the variations between the sample TMP and the reference TMP, and to adjust a rate of at least a portion of the I/O transactions that are carried out with at least one of the data storage devices in response to the variations in the environmental states identified by the sample TMP, the rate adjusted in relation to a location of the component with respect to the selected location of the selected data storage device.

2. The apparatus of claim 1 wherein the controller is further configured to schedule the selected data storage device for replacement responsive to the variations in the environmental states identified by the sample TMP.

3. The apparatus of claim 1 wherein the environmental sensors are vibration sensors, the component is a second selected data storage device at a distal location that induces vibrations in the selected storage device during a seek operation of the second selected data storage device, and the controller is further configured to adjust an operational state of at least a selected one of the selected data storage device or the second selected data storage device responsive to the comparison of the sample TMP to the reference TMP.

4. The apparatus of claim 1 wherein the environmental sensors are temperature sensors, the component is a cooling fan used to supply a flow of cooling air to the storage devices, and the controller is further configured to adjust an operational state of the cooling fan.

5. The apparatus of claim 1 wherein the sample TMP is a first sample TMP and the reference TMP is a first reference TMP, wherein the controller is configured to map a second sample TMP from a subsequent set of environmental data points in relation to the sensor locations and to compare the second sample TMP to a second reference TMP.

6. The apparatus of claim 1 further comprising an enclosure housing the data storage devices along multiple adjacent stacked rows, wherein the controller is configured to use the reference TMP to identify a correlation between the environmental state of each selected one of the data storage devices to each of the remaining data storage devices, and use the identified correlation to identify a source of the variations in the sample TMP.

7. The apparatus of claim 1 wherein the controller is further configured to adjust a fan motor speed based on the comparison.

8. The apparatus of claim 1 wherein the controller is further configured to schedule a second selected data storage device for replacement responsive to the variations between the sample TMP and the reference TMP.

9. The apparatus of claim 1 further comprising:
    a global clock for the plurality of data storage devices; and
    sync logic computer instructions stored in a computer memory and configured to synchronize each individual clock to the global clock, wherein the environmental control logic computer instructions operate to construct the reference TMP using the environmental data points from one selected point in time as determined by the global clock to provide an instantaneous snapshot of the environmental condition of the multi-dimensional array, and wherein the sample TMP is constructed to provide a second instantaneous snapshot of the environmental condition of the multi-dimensional array at a subsequent second selected point in time.

10. The apparatus of claim 1 wherein the environmental data points indicate temperatures of the data storage devices.

11. The apparatus of claim 1 wherein the environmental data points indicate vibration of the data storage devices inside an enclosure, the vibration comprising rotational vibration induced by activation of a first one of the data storage devices, the reference TMP indicating an effect of the rotational vibration on a second one of the data storage devices.

12. The apparatus of claim 1 wherein each data storage device operates according to an individual clock, wherein the controller is configured to synchronize a global clock to each individual clock, and further wherein the environmental control logic is configured to simultaneously query, with respect to the global clock, the subset of the data storage devices to obtain the environmental data points from a selected instant in time.

13. An system comprising:
an enclosure;
a plurality of data storage devices arranged within the enclosure as a multi-axial array along at least two orthogonal axes, each of the data storage devices having a storage medium and an environmental sensor, the environmental sensor operated according to an individual clock;
a global clock for the plurality of data storage devices;
sync logic computer instructions stored in a computer memory and executable by a processor to synchronize each individual clock to the global clock; and
environmental control logic computer instructions stored in a computer memory and executable by a processor to simultaneously, in relation to the global clock, obtain environmental data points from the environmental sensors of at least a subset of the plurality of data storage devices, to construct a reference profile of the environmental data points in relation to locations of the environmental sensors to identify variations in the environmental states of the data storage devices along at least two of the orthogonal axes of the multi-dimensional array; and
data transfer control logic computer instructions stored in a computer memory and executable by a processor to adjust a rate at which I/O transactions are carried out with at least one of the data storage devices in response to variations in the environmental states identified by a subsequently generated sample profile in comparison to the reference profile, the data transfer control logic computer instructions executed by the processor identifying a source of the variations in the environmental states as a selected data storage device located at an intersection of a first axis and an orthogonal second axis within the enclosure, the rate of the I/O transactions adjusted in relation to a source of the variations identified from the reference profile.

14. The system of claim 13 wherein the reference profile comprises at least a first profile that indicates the variations in the environmental states along a first axis and a second profile that indicates the variations in the environmental states along a second axis, and wherein the environmental state of a selected data storage is provided in both the first and second profiles at which the first and second axes intersect.

15. The system of claim 13 wherein the sync logic computer instructions are configured to interpolate between two mapped individual clock times.

16. The system of claim 13 wherein the data storage devices are arranged in a three dimensional rectangular array and the profile is constructed for at least one of a row and a column location of the environmental sensors.

17. A computer-implemented method for operating an apparatus having a plurality of data storage devices arranged into a multi-axial array, the method comprising:
establishing a global clock among the plurality of data storage devices;
simultaneously obtaining environmental data points from at least a subset of the data storage devices according to the global clock;
generating a sample profile of an environmental state of the data storage devices responsive to the environmental data points along at least two orthogonal axes;
comparing the sample profile to a previously generated reference profile; and
responsive to a variation between the profile and the reference profile by at least a predetermined amount, adjusting an environmental state of at least a selected one of the data storage devices, the variation comprising a difference between the environmental state of a selected data storage device at a selected location in the sample profile and the reference profile exceeding a predetermined amount along both a first axis and an orthogonal second axis, the rate of the I/O transactions adjusted in relation to a source of the variations identified from the reference profile, the selected data storage device located at an intersection between the first axis and the orthogonal second axis.

18. The method of claim 17 wherein the adjusted environmental state comprises reducing a rate at which data transfers are carried out between a host memory and the storage media of the selected one of the data storage devices.

19. The method of claim 17 wherein the adjusted environmental state comprises routing I/O workload away from the selected one of the data storage devices responsive to a detected elevated temperature at the intersection of the first and second axes.

20. The method of claim 17, further comprising identifying the source of the variation at a second selected location within the enclosure distal from the selected data storage device and adjusting operation of a component at the second selected location to correct the variations between the sample profile and the reference profile.

* * * * *